(12) United States Patent
Chiu

(10) Patent No.: US 10,803,966 B1
(45) Date of Patent: Oct. 13, 2020

(54) METHOD OF BLOWING AN ANTIFUSE ELEMENT

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/512,401

(22) Filed: Jul. 16, 2019

(51) Int. Cl.
*G11C 17/18* (2006.01)
*H01L 23/525* (2006.01)
*G11C 17/16* (2006.01)
*G11C 17/14* (2006.01)

(52) U.S. Cl.
CPC ............ *G11C 17/18* (2013.01); *G11C 17/14* (2013.01); *G11C 17/16* (2013.01); *H01L 23/5252* (2013.01)

(58) Field of Classification Search
CPC ......... G11C 17/18; G11C 17/16; G11C 17/14; H01L 23/5252
See application file for complete search history.

(56) References Cited

U.S. PATENT DOCUMENTS 6,700,151 B2 * 3/2004 Peng .................... H01L 27/112
257/253

FOREIGN PATENT DOCUMENTS

TW          I430275 B      3/2014
TW       201919198 A      5/2019

* cited by examiner

*Primary Examiner* — Jung Kim
(74) *Attorney, Agent, or Firm* — CKC & Partners Co., LLC

(57) ABSTRACT

A method of blowing an antifuse element is disclosed. An antifuse element including a first conductor, a second conductor, and a dielectric layer disposed between the first conductor and the second conductor is received, wherein the dielectric layer has a breakdown voltage. A first voltage is applied between the first conductor and the second conductor within a first time period, wherein the first voltage is less than the breakdown voltage. After applying the first voltage, a second voltage is applied between the first conductor and the second conductor to blow the antifuse element within a second time period, wherein the second voltage is greater than the breakdown voltage.

17 Claims, 9 Drawing Sheets

METHOD OF BLOWING AN ANTIFUSE ELEMENT

BACKGROUND

Field of Invention

The present disclosure relates to a method of blowing an antifuse element.

Description of Related Art

Integrated circuit (IC) devices are usually made with all internal connections set during the manufacturing process. However, due to long manufacturing times, high development costs, and high manufacturing tooling costs for manufacturing such integrated circuits, users would desire that circuits can be programmed or configured in the field. Such circuits are called programmable circuits, which usually include programmable links. Programmable links are electrical interconnects which are either broken or created at selected electronic nodes by the user, after the integrated circuit device has been fabricated and packaged in order to activate or deactivate respective selected electronic nodes.

One type of the programmable links is a fuse element. In IC devices, circuits are programmed by blowing the fuse element at selected cross-over points to create an open circuit. Besides, another type of programmable links is an antifuse element, which performs the opposite function to the fuse element. The antifuse element starts with a high resistance and is designed to permanently create an electrically conductive path. More specifically, the antifuse element is programmed by blowing the antifuse element at selected cross-over points to create a short circuit or a relatively low resistance link therein. However, after the traditional blowing process, the antifuse element usually has an unstable post-breakdown resistance. In view of the descriptions above, it is required to provide a new method of blowing an antifuse element.

SUMMARY

The present disclosure provides a method of blowing an antifuse element. An antifuse element including a first conductor, a second conductor, and a dielectric layer disposed between the first conductor and the second conductor is received, wherein the dielectric layer has a breakdown voltage. A first voltage is applied between the first conductor and the second conductor within a first time period, wherein the first voltage is less than the breakdown voltage. After applying the first voltage, a second voltage is applied between the first conductor and the second conductor to blow the antifuse element within a second time period, wherein the second voltage is greater than the breakdown voltage.

In some embodiments, the first voltage is a constant value within the first time period.

In some embodiments, the second voltage is a constant value within the second time period.

In some embodiments, the second time period is immediately subsequent to the first time period.

In some embodiments, the first time period is equivalent to the second time period.

In some embodiments, the first time period is greater than the second time period.

In some embodiments, after applying the first voltage and before applying the second voltage, a third voltage is applied between the first conductor and the second conductor within a third time period, wherein the third voltage is between the first voltage and the breakdown voltage.

In some embodiments, the third voltage is a constant value within the third time period.

In some embodiments, the first time period, the second time period, and the third time period are equivalent.

In some embodiments, the first time period is greater than the third time period, and the third time period is greater than the second time period.

In some embodiments, the second time period is equivalent to a total time period of the first time period and the third time period.

In some embodiments, the second time period is greater than each of the first time period and the third time period.

In some embodiments, the first voltage is 35-45% of the breakdown voltage, the third voltage is 75-85% of the breakdown voltage, and the second voltage is 115-125% of the breakdown voltage.

In some embodiments, the first voltage is 35-45% of the breakdown voltage, the third voltage is 55-65% of the breakdown voltage, and the second voltage is 115-125% of the breakdown voltage.

In some embodiments, the first voltage is 35-45% of the breakdown voltage, the third voltage is 85-95% of the breakdown voltage, and the second voltage is 115-125% of the breakdown voltage.

In some embodiments, after applying the third voltage and before applying the second voltage, a fourth voltage is applied between the first conductor and the second conductor within a fourth time period, wherein the fourth voltage is between the third voltage and the breakdown voltage.

In some embodiments, after applying the fourth voltage and before applying the second voltage, a fifth voltage is applied between the first conductor and the second conductor within a fifth time period, wherein the fifth voltage is between the fourth voltage and the breakdown voltage.

In some embodiments, after applying the second voltage, a sixth voltage is applied between the first conductor and the second conductor within a sixth time period, wherein the sixth voltage is greater than the second voltage.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
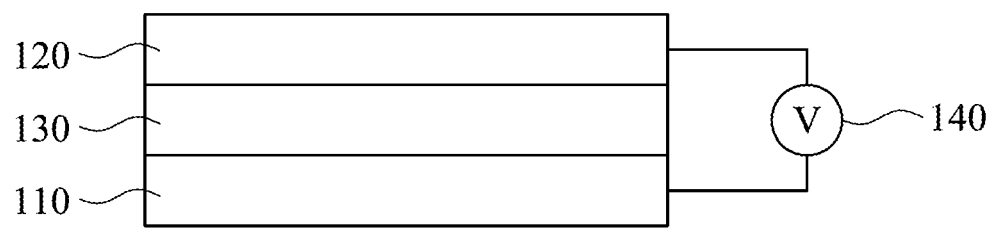
FIG. 1 is a cross-sectional view schematically illustrating an antifuse element according to various embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 2A:
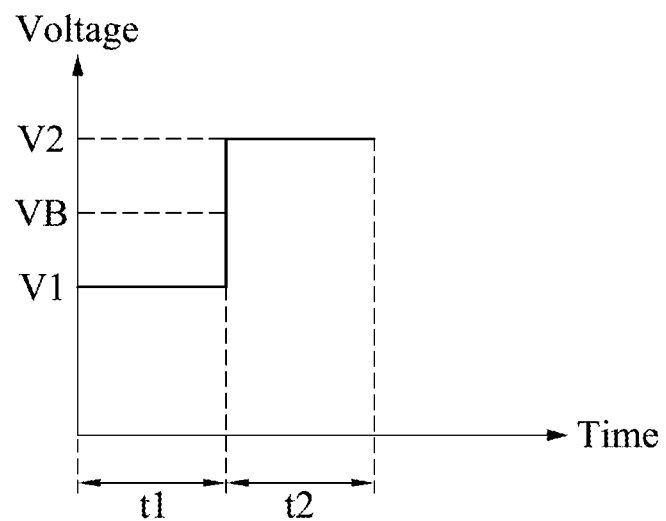
FIGS. 2A-7 respectively illustrate a voltage-time diagram according to various embodiments of the present disclosure.

The present disclosure provides a method of blowing an antifuse element. FIG. 1 is a cross-sectional view schematically illustrating an antifuse element according to various embodiments of the present disclosure. FIG. 2A illustrates a voltage-time diagram according to various embodiments of the present disclosure.

As shown in FIG. 1, one or more antifuse elements 100 are provided or received. Although FIG. 1 only shows a single antifuse element 100, it is understood that a plurality of antifuse elements 100 may be provided or formed in a semiconductor structure on a wafer. Furthermore, other semiconductor devices such as transistors, capacitors etc. may be included and positioned adjacent to the antifuse elements 100.

The antifuse element 100 includes a first conductor 110, a second conductor 120, and a dielectric layer 130 disposed between the first conductor 110 and the second conductor 120. In some embodiments, the first conductor 110 and the second conductor 120 respectively include metal or other suitable conductive materials, such as doped semiconductor materials. The doped semiconductor materials may be doped polysilicon. In some embodiments, the dielectric layer 130 includes silicon dioxide ($SiO_2$), silicon nitride (SiN), silicon oxide-silicon oxynitride-silicon oxide (ONO), or a combination thereof. In some embodiments, the dielectric layer 130 includes gate oxide (GOX). In some embodiments, the thickness of the dielectric layer 130 is 25 Å to 30 Å.

Subsequently, two different voltages are sequentially applied between the first conductor 110 and the second conductor 120. Please refer to FIG. 2A for detailed explanation. A first voltage V1 is applied between the first conductor 110 and the second conductor 120 within a first time period t1. The dielectric layer 130 has a breakdown voltage VB. The first voltage V1 is less than the breakdown voltage VB. After applying the first voltage V1, a second voltage V2 is applied between the first conductor 110 and the second conductor 120 to blow the antifuse element 100 within a second time period t2, wherein the second voltage V2 is greater than the breakdown voltage VB.

Generally, the antifuse element 100 is utilized within the field of integrated circuit devices and processes for a number of purposes, including programming alterable circuit connections, or replacing defective circuit elements with redundant circuit elements. The dielectric layer 130 is subject to breakdown upon application of sufficient voltage and current to the first conductor 110 and the second conductor 120. The resistance across the dielectric layer 130 of the antifuse element 100 encodes the "on" or "off" state of the antifuse element 100. After breakdown, the post-breakdown resistance across the dielectric layer 130 is measurably lower, indicating the "on" state. The on-off state of the antifuse element 100 is read by using a resistance measuring circuit.

It is noted that, because the first voltage V1 is less than the breakdown voltage VB as shown in FIG. 2A, charges would accumulate on the first conductor 110 and the second conductor 120 without flowing through the dielectric layer 130, and the dielectric layer 130 is not broken down within the first time period t1. Subsequently, the second voltage V2, which is greater than the breakdown voltage VB, is applied between the first conductor 110 and the second conductor 120 to break down the dielectric layer 130, and the previous accumulated charges would flow through the dielectric layer 130 to help a conductive path be formed in the dielectric layer 130 at this time. Accordingly, the antifuse element 100 can have a stable and low enough post-breakdown resistance. More specifically, the post-breakdown resistance does almost not vary with different measured voltages. Moreover, even if the thickness of the dielectric layer 130 is not very uniform, the antifuse element 100 can still have a stable and low enough post-breakdown resistance.

In some embodiments, the first voltage V1 and the second voltage V2 are provided by a voltage source 140 shown in FIG. 1. In some embodiments, the first voltage V1 is a constant value within the first time period t1 as shown in FIG. 2A. In some embodiments, the second voltage V2 is a constant value within the second time period t2 as shown in FIG. 2A. In some embodiments, the second time period t2 is immediately subsequent to the first time period t1 as shown in FIG. 2A. In some embodiments, the first time period t1 is equivalent to the second time period t2 as shown in FIG. 2A, but not limited thereto.

Figure 2B:
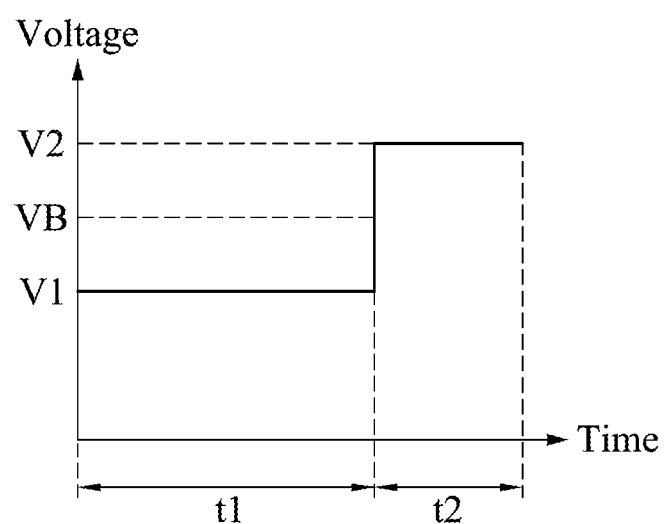

Please refer to FIG. 2B. FIG. 2B illustrates a voltage-time diagram according to yet some embodiments of the present disclosure. The difference between FIG. 2B and FIG. 2A is that, in FIG. 2B, the first time period t1 is greater than the second time period t2.

Figure 3A:
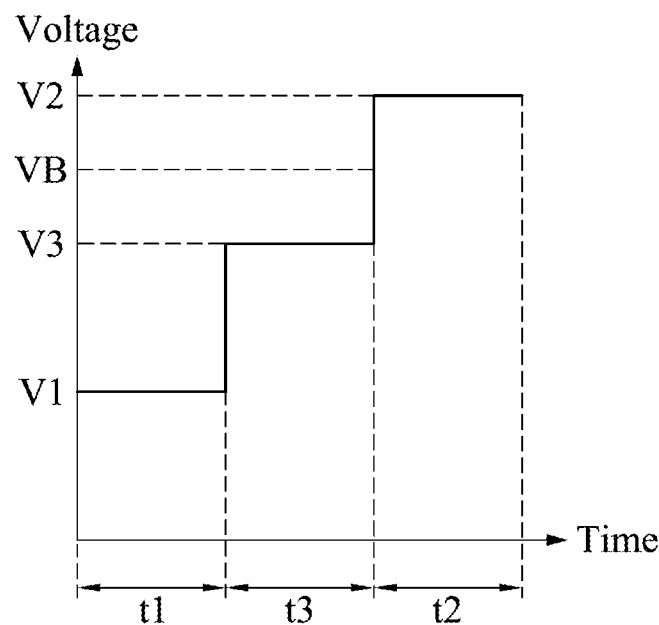

Please refer to FIG. 3A. FIG. 3A illustrates a voltage-time diagram according to various embodiments of the present disclosure. In some embodiments, as shown in FIG. 3A, after applying the first voltage V1 and before applying the second voltage V2, a third voltage V3 is applied between the first conductor 110 and the second conductor 120 within a third time period t3, wherein the third voltage V3 is between the first voltage V1 and the breakdown voltage VB.

In some embodiments, the third voltage V3 is provided by the voltage source 140 shown in FIG. 1. In some embodiments, the third voltage V3 is a constant value within the third time period t3 as shown in FIG. 3A. In some embodiments, the third time period t3 is immediately subsequent to the first time period t1 as shown in FIG. 3A. In some embodiments, the second time period t2 is immediately subsequent to the third time period t3 as shown in FIG. 3A. In some embodiments, the first time period t1, the second time period t2, and the third time period t3 are equivalent as shown in FIG. 3A, but not limited thereto. In some embodiments, the first voltage V1 is 35-45% of the breakdown voltage VB, the third voltage V3 is 75-85% of the breakdown voltage VB, and the second voltage V2 is 115-125% of the breakdown voltage VB.

Figure 3B:
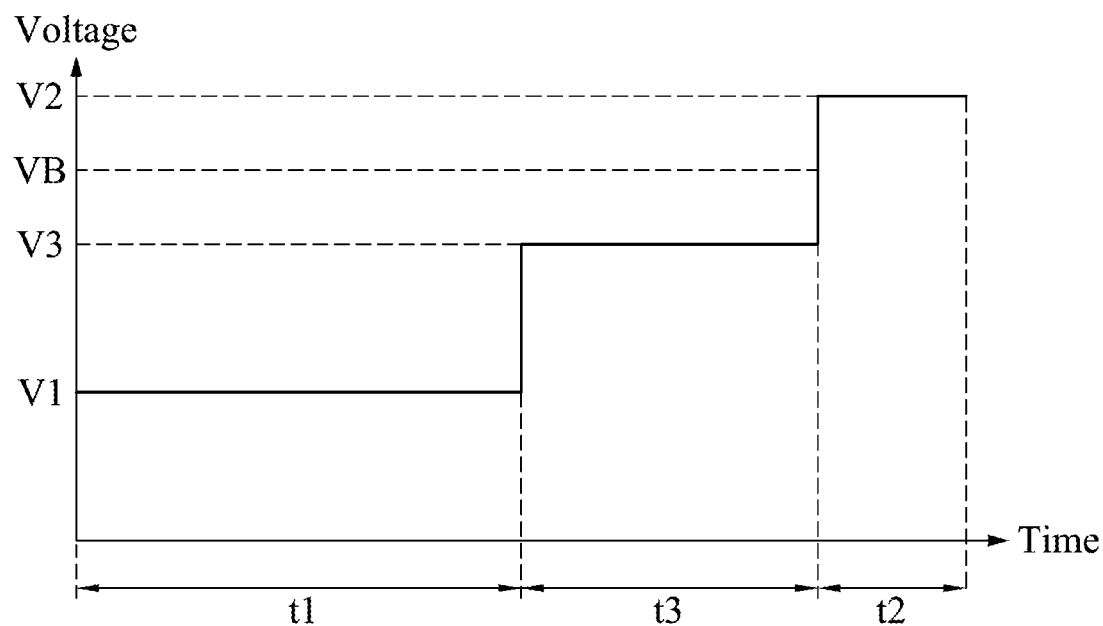

Please refer to FIG. 3B. FIG. 3B illustrates a voltage-time diagram according to various embodiments of the present disclosure. The difference between FIG. 3B and FIG. 3A is that, in FIG. 3B, the first time period t1 is greater than the third time period t3, and the third time period t3 is greater than the second time period t2.

Figure 3C:
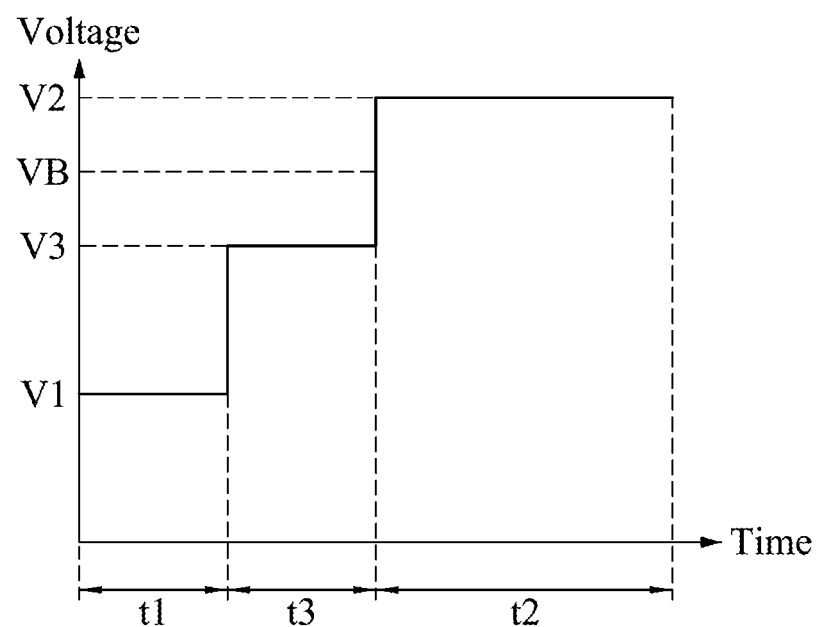

Please refer to FIG. 3C. FIG. 3C illustrates a voltage-time diagram according to various embodiments of the present disclosure. The difference between FIG. 3C and FIG. 3A is that, in FIG. 3C, the second time period t2 is greater than each of the first time period t1 and the third time period t3. In some embodiments, the second time period t2 is equivalent to a total time period of the first time period t1 and the third time period t3 as shown in FIG. 3C. In some embodiments, the first time period t1 is equivalent to the third time period t3 as shown in FIG. 3C.

Figure 4A:
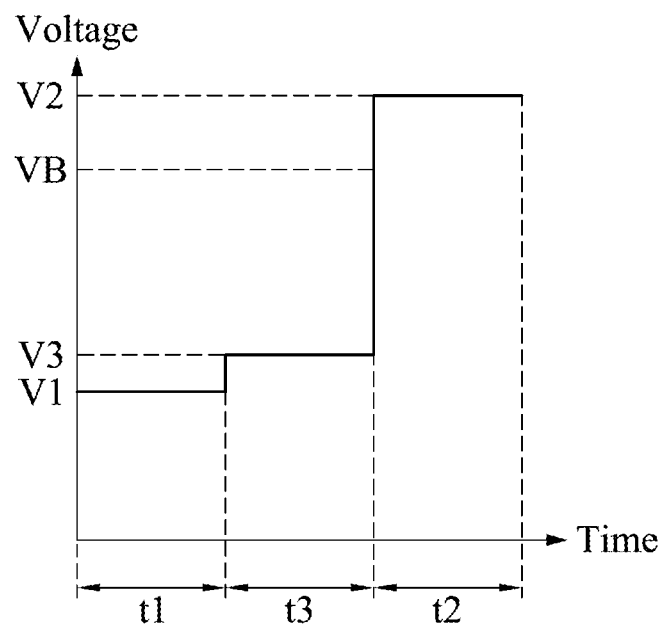

Please refer to FIG. 4A. FIG. 4A illustrates a voltage-time diagram according to various embodiments of the present disclosure. As shown in FIG. 4A, in some embodiments, the first voltage V1 is 35-45% of the breakdown voltage VB, the third voltage V3 is 55-65% of the breakdown voltage VB, and the second voltage V2 is 115-125% of the breakdown voltage VB.

Figure 4B:
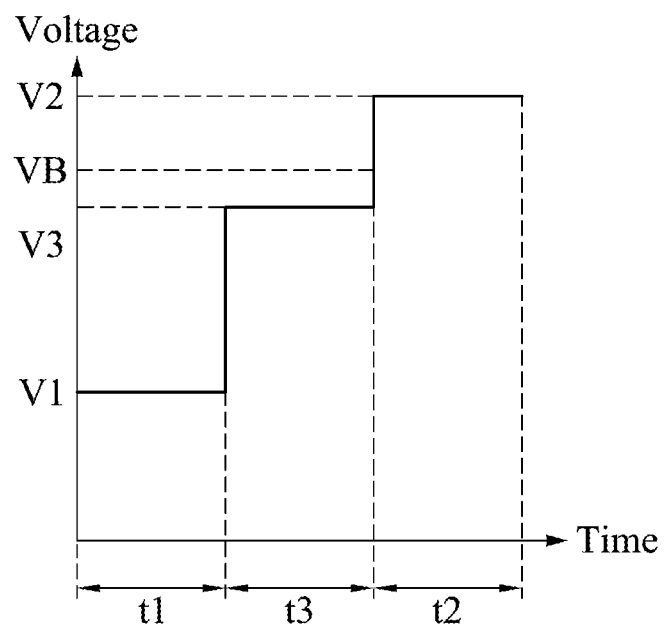

Please refer to FIG. 4B. FIG. 4B illustrates a voltage-time diagram according to various embodiments of the present disclosure. As shown in FIG. 4B, in some embodiments, the first voltage V1 is 35-45% of the breakdown voltage VB, the third voltage V3 is 85-95% of the breakdown voltage VB, and the second voltage V2 is 115-125% of the breakdown voltage VB.

Figure 5:
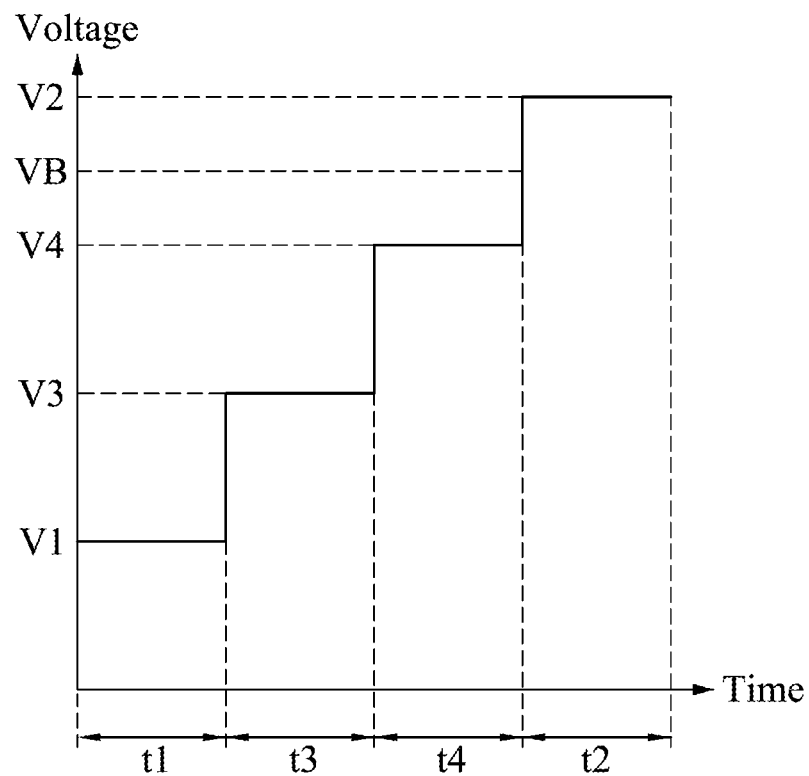

Please refer to FIG. 5. FIG. 5 illustrates a voltage-time diagram according to various embodiments of the present disclosure. In some embodiments, as shown in FIG. 5, after applying the third voltage V3 and before applying the second voltage V2, a fourth voltage V4 is applied between the first conductor 110 and the second conductor 120 within a fourth time period t4, wherein the fourth voltage V4 is between the third voltage V3 and the breakdown voltage VB.

In some embodiments, the fourth voltage V4 is provided by the voltage source 140 shown in FIG. 1. In some embodiments, the fourth voltage V4 is a constant value within the fourth time period t4 as shown in FIG. 5. In some embodiments, the fourth time period t4 is immediately subsequent to the third time period t3 as shown in FIG. 5. In some embodiments, the second time period t2 is immediately subsequent to the fourth time period t4 as shown in FIG. 5. In some embodiments, the first time period t1, the second time period t2, the third time period t3, and the fourth time period t4 are equivalent as shown in FIG. 5, but not limited thereto.

Figure 6:
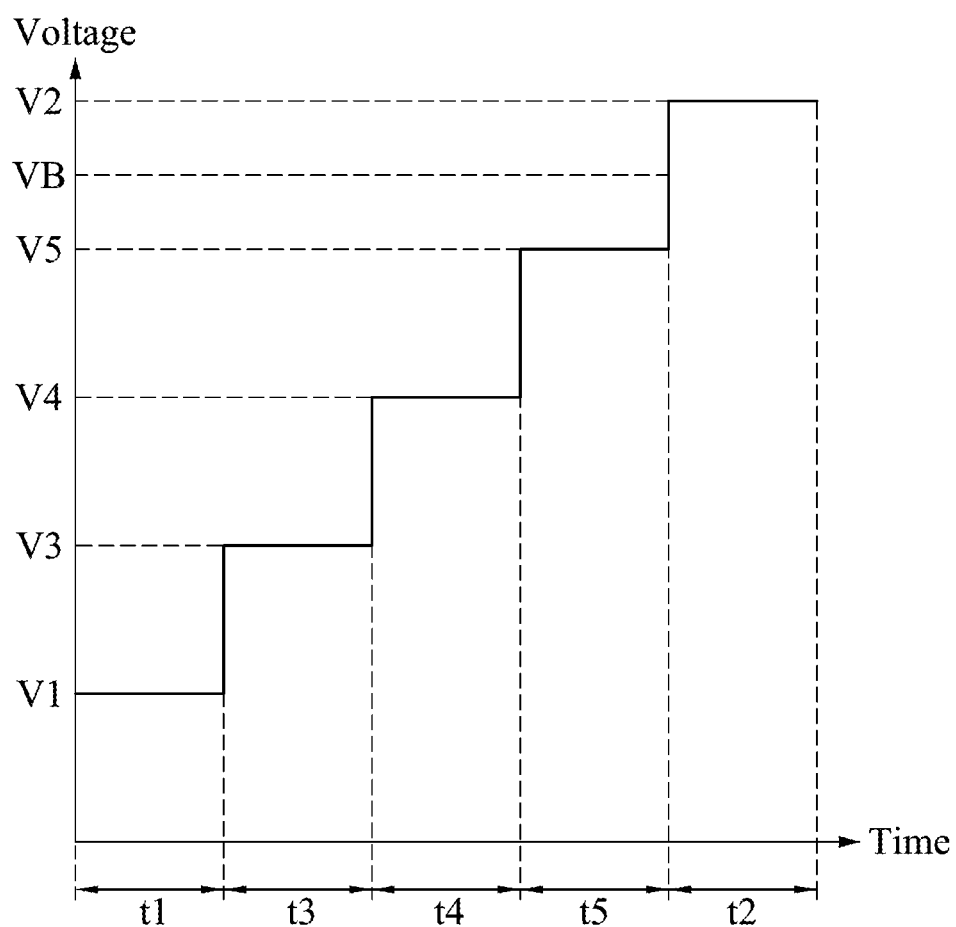

Please refer to FIG. 6. FIG. 6 illustrates a voltage-time diagram according to various embodiments of the present disclosure. In some embodiments, as shown in FIG. 6, after applying the fourth voltage V4 and before applying the second voltage V2, a fifth voltage V5 is applied between the first conductor 110 and the second conductor 120 within a fifth time period t5, wherein the fifth voltage V5 is between the fourth voltage V4 and the breakdown voltage VB.

In some embodiments, the fifth voltage V5 is provided by the voltage source 140 shown in FIG. 1. In some embodiments, the fifth voltage V5 is a constant value within the fifth time period t5 as shown in FIG. 6. In some embodiments, the fifth time period t5 is immediately subsequent to the fourth time period t4 as shown in FIG. 6. In some embodiments, the second time period t2 is immediately subsequent to the fifth time period t5 as shown in FIG. 6. In some embodiments, the first time period t1, the second time period t2, the third time period t3, the fourth time period t4, and the fifth time period t5 are equivalent as shown in FIG. 6, but not limited thereto.

Figure 7:
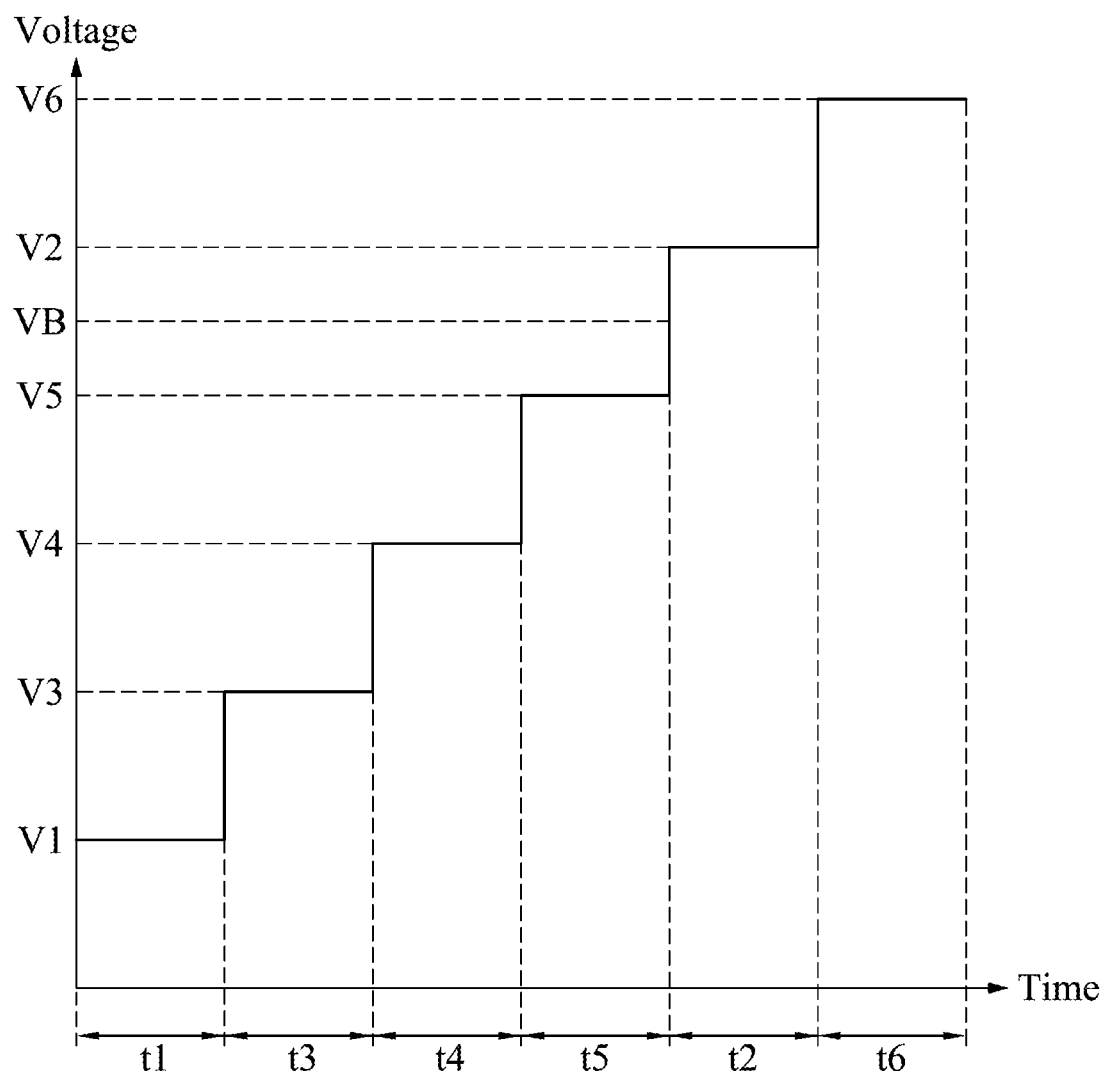

Please refer to FIG. 7. FIG. 7 illustrates a voltage-time diagram according to various embodiments of the present disclosure. In some embodiments, as shown in FIG. 7, after applying the second voltage V2, a sixth voltage V6 is applied between the first conductor 110 and the second conductor 120 within a sixth time period t6, wherein the sixth voltage V6 is greater than the second voltage V2.

In some embodiments, the sixth voltage V6 is provided by the voltage source 140 shown in FIG. 1. In some embodiments, the sixth voltage V6 is a constant value within the sixth time period t6 as shown in FIG. 7. In some embodiments, the sixth time period t6 is immediately subsequent to the second time period t2 as shown in FIG. 7. In some embodiments, the first time period t1, the second time period t2, the third time period t3, the fourth time period t4, the fifth time period t5, and the sixth time period t6 are equivalent as shown in FIG. 7, but not limited thereto.

Please refer back to FIGS. 2A, 2B, 3A, 3B, 3C, 4A, 4B, and 5. In some embodiments, after applying the second voltage V2, a sixth voltage V6 (not shown in these figures) is applied between the first conductor 110 and the second conductor 120 within a sixth time period t6 (not shown in these figures), wherein the sixth voltage V6 is greater than the second voltage V2.

Measurement of Post-Breakdown Resistance

Figure 8:
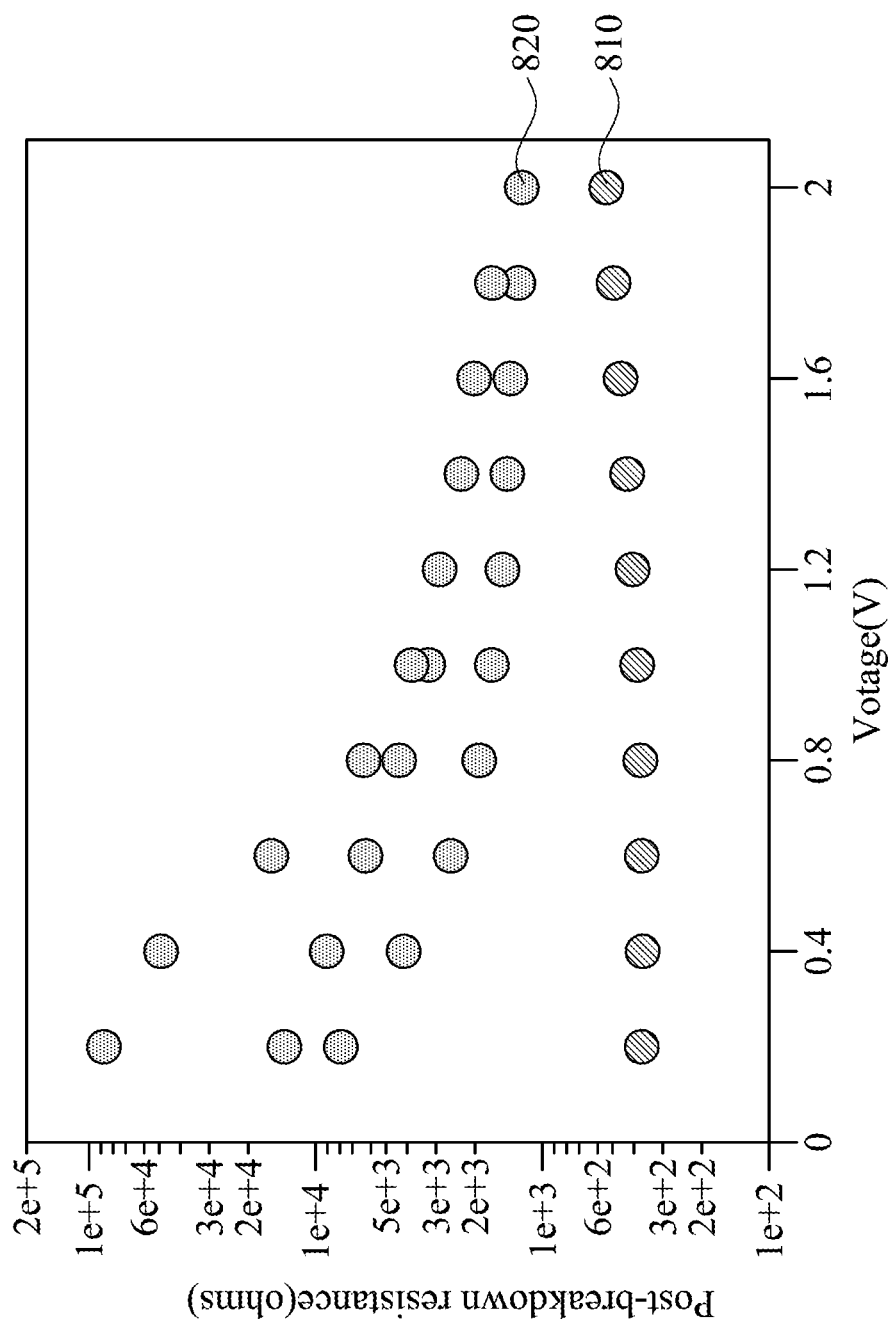
FIG. 8 illustrates a post-breakdown resistance-voltage diagram according to an Example and a Comparative Example.

An Example and a Comparative Example were provided. In the Example and the Comparative Example, the antifuse element 100 was used to be blown out. The antifuse element 100 included the first conductor 110, the second conductor 120, and the dielectric layer 130 disposed between the first conductor 110 and the second conductor 120. The dielectric layer 130 was a $SiO_2$ layer with a thickness of 25 Å and had a breakdown voltage of about 4.2V. After blowing the antifuse element 100, the post-breakdown resistance of the antifuse element 100 was measured. The result was shown in FIG. 8. FIG. 8 illustrated the post-breakdown resistance-voltage diagram according to the Example and the Comparative Example.

In the Example, a series of different voltages was applied between the first conductor 110 and the second conductor 120 to blow the antifuse element 100. Please refer to FIG. 7 for detailed explanation. The voltages, V1, V3, V4, V5, V2, and V6, were 1V, 2V, 3V, 4V, 5V, and 6V, respectively. The time periods, t1, t3, t4, t5, t2, and t6 were 5 ms, respectively. The post-breakdown resistance of the antifuse element 100 was measured under different voltages. Five antifuse elements 100 were blown out and measured by the above operations. The measured results were data points 810 shown in FIG. 8. The data points 810 almost overlapped at each measured voltage.

On the other hand, in the Comparative Example, one fixed voltage of 6V is applied between the first conductor 110 and the second conductor 120 within a time period of 3 ms to blow the antifuse element 100. The post-breakdown resistance of the antifuse element 100 was measured under different voltages. Three antifuse elements 100 were blown out and measured by the above operations. The measured results were data points 820 shown in FIG. 8.

Please refer to FIG. 8. From the data points 810, it can be seen that the post-breakdown resistance of the antifuse element 100 in the Example did almost not vary with different measured voltages. On the contrary, from the data points 820, it can be seen that the post-breakdown resistance of the antifuse element 100 in the Comparative Example varied with different measured voltages. Moreover, at each measured voltage, the post-breakdown resistance of the antifuse element 100 in the Example was lower than that of the antifuse element 100 in the Comparative Example. Therefore, it can be known that, the antifuse element 100 in the Example had a stable and low enough post-breakdown resistance.

In view of the foregoing, before applying a voltage to blow an antifuse element including conductors and a dielectric layer between the conductors, applying at least another one voltage less than the breakdown voltage of the dielectric layer to accumulate charges on the conductors is beneficial for blowing out the antifuse element, and thus the antifuse element can have a stable and low enough post-breakdown resistance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of blowing an antifuse element, the method comprising:
  receiving an antifuse element comprising a first conductor, a second conductor, and a dielectric layer disposed between the first conductor and the second conductor, wherein the dielectric layer has a breakdown voltage;
  applying a first voltage between the first conductor and the second conductor within a first time period, wherein the first voltage is less than the breakdown voltage; and
  after applying the first voltage, applying a second voltage between the first conductor and the second conductor to blow the antifuse element within a second time period, wherein the second voltage is greater than the breakdown voltage, and the second time period is immediately subsequent to the first time period.

2. The method of claim 1, wherein the first voltage is a constant value within the first time period.

3. The method of claim 1, wherein the second voltage is a constant value within the second time period.

4. The method of claim 1, wherein the first time period is equivalent to the second time period.

5. The method of claim 1, wherein the first time period is greater than the second time period.

6. The method of claim 1, after applying the first voltage and before applying the second voltage, further comprising applying a third voltage between the first conductor and the second conductor within a third time period, wherein the third voltage is between the first voltage and the breakdown voltage.

7. The method of claim 6, wherein the third voltage is a constant value within the third time period.

8. The method of claim 6, wherein the first time period, the second time period, and the third time period are equivalent.

9. The method of claim 6, wherein the first time period is greater than the third time period, and the third time period is greater than the second time period.

10. The method of claim 6, wherein the second time period is equivalent to a total time period of the first time period and the third time period.

11. The method of claim 6, wherein the second time period is greater than each of the first time period and the third time period.

12. The method of claim 6, wherein the first voltage is 35-45% of the breakdown voltage, the third voltage is 75-85% of the breakdown voltage, and the second voltage is 115-125% of the breakdown voltage.

13. The method of claim 6, wherein the first voltage is 35-45% of the breakdown voltage, the third voltage is 55-65% of the breakdown voltage, and the second voltage is 115-125% of the breakdown voltage.

14. The method of claim 6, wherein the first voltage is 35-45% of the breakdown voltage, the third voltage is 85-95% of the breakdown voltage, and the second voltage is 115-125% of the breakdown voltage.

15. The method of claim 6, after applying the third voltage and before applying the second voltage, further comprising applying a fourth voltage between the first conductor and the second conductor within a fourth time period, wherein the fourth voltage is between the third voltage and the breakdown voltage.

16. The method of claim 15, after applying the fourth voltage and before applying the second voltage, further comprising applying a fifth voltage between the first conductor and the second conductor within a fifth time period, wherein the fifth voltage is between the fourth voltage and the breakdown voltage.

17. The method of claim 16, after applying the second voltage, further comprising applying a sixth voltage between the first conductor and the second conductor within a sixth time period, wherein the sixth voltage is greater than the second voltage.

\* \* \* \* \*